(12) United States Patent
Kaji et al.

(10) Patent No.: US 7,928,376 B2
(45) Date of Patent: Apr. 19, 2011

(54) ELEMENT MAPPING UNIT, SCANNING TRANSMISSION ELECTRON MICROSCOPE, AND ELEMENT MAPPING METHOD

(75) Inventors: Kazutoshi Kaji, Hitachi (JP); Kazuhiro Ueda, Mito (JP); Koji Kimoto, Tsukuba (JP); Takashi Aoyama, Tokai-mura (JP); Shunroku Taya, Mito (JP); Shigeto Isakozawa, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/232,964

(22) Filed: Sep. 23, 2005

(65) Prior Publication Data

US 2006/0011836 A1   Jan. 19, 2006

Related U.S. Application Data

(63) Continuation of application No. 09/869,783, filed as application No. PCT/JP99/06418 on Nov. 17, 1999, now abandoned.

(30) Foreign Application Priority Data

Jan. 4, 1999  (JP) .............................. 11-98

(51) Int. Cl.
*H01J 47/00*  (2006.01)

(52) U.S. Cl. .......................... 250/305; 250/310; 250/311

(58) Field of Classification Search .................. 250/305
See application file for complete search history.

(56) References Cited

U.S. PATENT DOCUMENTS

| | | | |
|---|---|---|---|
| 4,480,220 A | 10/1984 | Isakozawa et al. | |
| 4,743,756 A | 5/1988 | Krivanek | |
| 4,831,255 A | 5/1989 | Krivanek | |
| 5,051,585 A * | 9/1991 | Koshishiba et al. | 850/9 |
| 5,300,775 A | 4/1994 | Van der Mast | |

(Continued)

FOREIGN PATENT DOCUMENTS

JP          57-080649          5/1982

(Continued)

OTHER PUBLICATIONS

Vladimir P. Oleshko; et al, Combined Characterization of Composite Tabular Silver Halide Microcrystals by Cryo-EFTEM/EELS and Cryo-STEM/EDX Techniques, 1998, Microscopy Research and Technique, 42, pp. 108-122.*

*Primary Examiner* — Phillip A Johnston
(74) *Attorney, Agent, or Firm* — Kenyon & Kenyon LLP

(57) ABSTRACT

There is provided an element mapping unit, scanning transmission electron microscope, and element mapping method that enable to acquire an element mapping image very easily. On the scanning transmission electron microscope, the electron beam transmitted through an object to be analyzed enters into the element mapping unit. The electron beam is analyzed of its energy into spectrum by an electron spectrometer and an electron energy loss spectrum is acquired. Because the acceleration voltage data for each element and window data for 2-window method, 3-window method or contrast tuning method are already stored in a database and accordingly the spectrum measurement is carried out immediately even when an element to be analyzed is changed to another, the operator can confirm a two-dimensional element distribution map immediately. Besides, because every electron beam that enters into an energy filter passes through the object point, aberration strain in the electron spectrometer can be minimized and higher energy stability can be achieved. As a result, drift of the electron energy loss spectrum acquired by analyzing the electron beam into spectrum can be minimized and element distribution with higher accuracy can be acquired.

9 Claims, 9 Drawing Sheets

U.S. PATENT DOCUMENTS

| | | | |
|---|---|---|---|
| 5,578,823 A * | 11/1996 | Taniguchi | 250/311 |
| 5,798,524 A * | 8/1998 | Kundmann et al. | 250/305 |
| 6,184,524 B1 * | 2/2001 | Brink et al. | 250/305 |
| 6,794,648 B2 * | 9/2004 | Kaji et al. | 250/311 |
| 2003/0085350 A1 * | 5/2003 | Kaji et al. | 250/305 |

FOREIGN PATENT DOCUMENTS

| | | |
|---|---|---|
| JP | 62-037857 | 2/1987 |
| JP | 06-052819 | 2/1994 |
| JP | 06-310063 | 11/1994 |
| JP | 06-310076 | 11/1994 |
| JP | 07-021966 | 1/1995 |
| JP | 07-021967 | 1/1995 |
| JP | 07-029544 | 1/1995 |
| JP | 08-222169 | 8/1996 |
| JP | 10-213538 | 8/1998 |
| JP | 11-067138 | 3/1999 |

* cited by examiner (a)

(b)

(a)

(b)

(a)

(b)

ELEMENT MAPPING UNIT, SCANNING TRANSMISSION ELECTRON MICROSCOPE, AND ELEMENT MAPPING METHOD

This is a continuation of application Ser. No. 09/869,783 filed 29 Jun. 2001 now abandoned, which is a 371 of PCT/JP99/06418 FILED 17 Nov. 1999, which claims priority to Japanese Patent Application No. 11-98 filed in Japan on 4 Jan. 1999, the contents of which are incorporated herein by reference in their entirety.

TECHNICAL FIELD

The present invention relates to an element mapping unit, scanning transmission electron microscope, and element mapping method.

BACKGROUND ART

As semiconductor element or magnetic head element has become smaller and more compact, the element is now structured by laminated thin films of several NMs (nanometers) within a micro region of submicrons. Since the performance of the semiconductor element or magnetic head element depends upon the structure, element distribution and crystal structure of the micro region, analysis of the micro region is very important.

For observation of the micro region, there are available a scanning electron microscope (SEM), transmission electron microscope (TEM), and scanning transmission electron microscope (STEM). TEM is an apparatus in which electron beams are irradiated onto a specimen nearly in parallel and the transmitted electron beams are magnified by a lens. STEM is an apparatus in which electron beams are converged into a micro region and, while the electron beams are scanned over a specimen two-dimensionally, the intensity of the transmitted electron beams is measured so as to acquire a two-dimensional image.

The intensity of a transmitted electron detected by a TEM and STEM correlates to the average atomic number of a portion through which the electron beam has transmitted. Because of this, thin films of chrome (Cr), manganese (Mn), iron (Fe), cobalt (Co), nickel (Ni) and copper (Cu), having an atomic number closer to each other, or silicon oxide film and silicone nitride film, having an average atomic number closer to each other, cannot be distinguished from each other.

In case of a metallic film, Cr, Mn, Fe, Co, Ni and Cu can be distinguished from each other by acquiring a two-dimensional image with the aid of fluorescent X-ray analysis. However, longer measuring time is required in obtaining the two-dimensional image because detectable fluorescent X-ray intensity is very weak. Since the fluorescent X-ray analysis is not suitable for analysis of light element, distinction of silicon oxide film from silicone nitride film is difficult.

As an analytical method for solving the above problems, there is available the electron energy loss spectroscopy (EELS) that analyzes energy of transmitted electron using an electron spectrometer. Because an electron, when it transmits through a specimen, causes energy loss peculiar to the structural element (electron structure) of the specimen, generating a two-dimensional image from the electrons after energy loss peculiar to the element makes it possible to distinguish between silicon oxide film and nitride film, which is not feasible on a TEM or STEM image. The above has been widely employed as a combined method of a STEM and a parallel-detection type electron energy loss spectrometer (EELS).

EELS has a fan-shaped magnetic field sector as an electron spectrometer, and is equipped with a quadruple electromagnetic lens before it and a sextuple electromagnetic lens after it, and a parallel detector at the most downstream. The sextuple electromagnetic lens is utilized to adjust the focus of an EELS spectrum and magnify the EELS spectrum. The quadruple electromagnetic lens is utilized to reduce the aberration of the EELS spectrum projected on the detector. The EELS spectrum magnified by the quadruple electromagnetic lens is projected on the parallel detector and electron energy loss spectra are measured in a wide range.

Prior arts relating to the structure of EELS include, for example, U.S. Pat. No. 4,743,756, Japanese Application Patent Laid-Open Publication Nos. HEI 7-21966 (1995), HEI 7-21967 (1995), and HEI 7-29544 (1995). The Laid-Open Publication No. SHO 57-80649 (1982) describes about an electron beam energy analyzer.

DISCLOSURE OF INVENTION

With a combined analyzer of conventional EELS and STEM, a user must repeat a series of processes; (1) specifying a measuring position→(2) specifying an element→(3) measuring the energy intensity distribution of electron beams at an electron beam detecting section→(4) correcting the background and gain at the detecting section→(5) specifying a background region→(6) specifying a background fitting function such as a power law model ($I=AE^{-r}$)→(7) specifying an integral region of signal intensity→(8) displaying the signal intensity of the specified element at the measuring position on an image display device→(1), at all measuring points. Acquiring a two-dimensional image, however, takes a vast amount of time and therefore, acquiring an element distribution image in real time is difficult. It may also be possible that, after measuring an EELS spectrum at every measuring point, the user specifies (2) to (7) above so as to acquire a two-dimensional image. With this method, however, measurement data results in a vast amount and an element distribution image cannot be acquired in real time.

When an element distribution image cannot be acquired in real time, problems as follows arise additionally.

(A) Since the field of view is confirmed on a TEM/STEM image when, for example, an interface between a silicon oxide film and a silicon nitride film is to be analyzed, a region of analysis (interface between the oxide film and the nitride film) cannot be distinguished. Because of this, whether a required measuring region is included in the real time on a combined analyzer of conventional EELS and STEM is difficult because of the drift of the EELS spectrum.

Besides, a conventional EELS is heavy in weight and complicated in structure because a lot of electromagnets are used in multiple quadruple electromagnetic lenses, sextuple electromagnetic lenses and electron spectrometers.

As the analyzer requires power supply for the electromagnets, AC noise suppressor, and cooling system in addition to the EELS itself, the apparatus has a complicated composition and costs high.

Besides, a conventional cold cathode field emission type STEM involves a technical problem concerning the apparatus, called chip noise, that the luminance of the electron beam source increases in the course of the measurement. Since the secondary electron intensity, Z contrast intensity, fluorescent X-ray intensity and EELS intensity increase during the measurement due to the chip noise, there remains a problem that whether an increase in the measuring region intensity is due to the effect of the chip noise or the increase of the signal intensity cannot be distinguished.

As explained above, it is difficult to acquire an element distribution image in real time using a combined analyzer of EELS and STEM.

An object of the present invention is to provide an apparatus and method that enable to acquire an element distribution image in real time using a combined analyzer of EELS and STEM.

Another object of the present invention is to improve the operability of an analyzer concerning EELS and/or STEM.

Another object of the present invention is to provide an apparatus with high EELS spectrum energy stability.

Another object of the present invention is to provide an energy filter for an element mapping unit which, in combination with a scanning transmission electron microscope, is capable of measuring EELS spectra and, at the same time, acquiring an element distribution image and an electron microscopic image with less effect of chip noise, and also to provide a light-weight transmission electron microscope equipped with the filter.

A conventional element mapping unit was capable of acquiring a distribution image of a single element but incapable of measuring the distribution of multiple elements and observing the positional relationship between each element to a resolution finer than nanometer.

Another object of the present invention is to provide an element mapping unit capable of acquiring a distribution image of multiple elements easily.

A characteristic feature of the present invention is that a scanning transmission electron microscope, comprising of an electron beam source that generates electron beams, scanning section that scans the electron beams, objective lens that converges the electron beam onto a specimen, electron spectrometer section that analyzes the energy of the electron beams into spectrum, and electron beam detecting section that detects part or whole of the electron beams analyzed by the electron spectrometer section, contains, at least, a computation unit that calculates using the electron beam intensity detected by the electron beam detecting section, and displays the calculation result of the computation unit on an image display device.

Besides, another characteristic feature of the present invention is that a series of processes; (1) specifying a measuring position→(2) specifying an element→(3) measuring the energy intensity distribution of electron beams at an electron beam detecting section→(4) correcting the background and gain at the detecting section→(5) specifying a background region→(6) specifying a background fitting function such as a power law model ($I=AE^{-r}$)→(7) specifying an integral region of signal intensity→(8) displaying the signal intensity of the specified element at the measuring position on an image display device→(1), which are repeated by a user (operator) for each measuring position and each element to be measured so as to acquire an element distribution image, are all processed on the apparatus side except for (1) specifying a measuring position→(2) specifying an element. With this feature, an element distribution map of a specified element can be acquired in real time. In addition, with this feature, the operability can be enhanced and the measuring time can be shortened.

Another characteristic feature of the present invention is that a scanning transmission electron microscope, comprising of an electron beam source that generates electron beams, scanning section that scans the electron beams, objective lens that converges the electron beam onto a specimen, electron spectrometer section that analyzes the energy of the electron beams into spectrum, and electron beam detecting section that detects part or whole of the electron beams analyzed by the electron spectrometer section, contains, at least, a computation unit that calculates using the electron beam intensity detected by the electron beam detecting section, is equipped with an image display device that displays the calculation result of the computation unit, and is provided with, at least, one or more lenses of permanent magnets between the electron beam energy loss spectrum (EELS spectrum) formed by the electron spectrometer section and the detecting section.

The magnetic field stability of a magnetic lens using permanent magnets is about $1 \times 10^{-8}$, which is more stable than that of a lens using electromagnets ($5 \times 10^{-6}$) by two digits or more. Use of permanent magnets in electron spectrometer section and lens enables to reduce the drift of the EELS spectrum to 0.1 channel or less under the measuring condition of an element distribution image.

As a result of the above, it becomes possible that the scanning transmission electron microscope is provided with a database of core loss energy of elements; the electron beam detecting section comprises of two or more channels; after the core loss energy of the specified element is acquired from the database, the electro-optical system of the electron spectrometer section and electron beam detecting section is adjusted automatically so that the electron beam of the core loss energy is detected; at the same time when the electron beams are scanned by the scanning section, the electron beam intensity just before and after the core loss energy of the specified element is measured by the electron beam detecting section, using at least each one channel; the background and gain at the electron beam detecting section are corrected by the computation unit; and that the electron beam intensity just after the core loss energy is divided by the electron beam intensity just before the core loss energy and the calculated result is displayed on an image display device in real time.

Besides, another characteristic feature of the present invention is that the scanning transmission electron microscope is provided with a database of core loss energy of elements; the electron beam detecting section comprises of three or more channels; after the core loss energy of the specified element is acquired from the database, the electro-optical system of the electron spectrometer section and electron beam detecting section is adjusted automatically so that the electron beam of the core loss energy is detected; at the same time when the electron beams are scanned by the scanning section, the electron beam intensity just before the core loss energy of the specified element is measured by the electron beam detecting section, using at least two channels, and so is the electron intensity just after the core loss energy, using at lease one channel. With this, it becomes possible that the computation unit corrects the background and gain at the electron beam detecting section, calculates the background of the electron beam intensity just after the core loss energy from the electron beam intensity distribution just before the core loss energy on the basis of a power law model ($I=AE^{-r}$), and than calculates the electron beam intensity just after the core loss energy automatically, and that the calculated result is displayed on an image display device in real time.

Further, it becomes possible that the scanning transmission electron microscope is provided with a database of plasmon loss energy distinctive to each element; after the plasmon loss energy of the specified element is acquired from the database, the electro-optical system of the electron spectrometer section and electron beam detecting section is adjusted automatically so that the electron beam of the plasmon loss energy is detected; at the same time when the electron beams are scanned by the scanning section, the electron beam intensity of the plasmon loss energy of the specified element is measured by the electron beam detecting section; and that the background and gain at the electron beam detecting section are corrected by the computation unit and the calculated result is displayed on an image display device in real time.

Besides, provided that the electron beam detecting section comprises of two or more channels, the electron beam intensity of each plasmon loss energy of two or more elements is measured by each channel of the electron beam detecting section, the background and gain at the electron beam detecting section are corrected by the computation unit, and that the calculated result of each channel of the electron beam detecting section is displayed in different tints of a specified color on an image display device in real time, it also becomes possible to display a contrast tuning image in which a specified element is contrasted.

Besides, provided that the electron beam detecting section comprises of two or more channels; the electro-optical system of the electron spectrometer section and electron beam detecting section is adjusted automatically (this means, for example, the apparatus operates specified processing based on a processing program) so that the zero loss electron beam and plasmon loss energy electron beam are detected; at the same time when the electron beams are scanned by the scanning section, the zero loss electron beam intensity is measured, using at least one channel of the electron beam detecting section, and the core loss energy electron beam intensity is measured, using at least another one channel of the electron beam detecting section; the background and gain at the electron beam detecting section are corrected by the computation unit; and that the plasmon loss energy electron beam intensity is divided by the zero loss electron beam intensity and the calculated result is displayed on an image display device in real time, it also becomes possible to achieve film thickness mapping of a specimen.

(Background Correction)

The background correction and gain correction peculiar to the electron beam detecting section is explained hereunder. An electron beam detector exhibits a background due to thermal oscillation of electrons of the detector itself even when no electron beam has been input to the detector. Besides, a detector comprising of multiple channels exhibits different sensitivity (gain) on each channel. The background correction and gain correction peculiar to the electron beam detecting section is to correct the above two. They are corrected as follows. For the background correction, the intensity detected by the electron beam detector while the detector is kept free from entry of electron beam is stored in a storage device of the computation unit as the background. The electron beam intensity obtained during the measurement of an element distribution image is corrected by deducting the background intensity stored previously and the difference is regarded as the electron beam intensity.

(Gain Correction)

For the gain correction, AC current is superimposed into a drift tube while measuring the zero loss so that electron beams of even intensity enter the whole detector. The electron beam intensity is measured by the electron beam detector. The whole electron beam intensity measured is divided by the number of channels so as to obtain an average electron beam quantity per channel. The average electron beam intensity is then divided by the electron beam intensity measured at each channel so as to obtain a coefficient, which is then stored in the storage device as a gain correction factor of each channel.

The electron beam intensity obtained at each channel during the measurement of an element distribution image is corrected by multiplying the gain correction factor of each channel stored previously and the product is regarded as the electron beam intensity.

Besides, provided that the scanning transmission electron microscope is equipped with a secondary electron detecting section or Z contrast detecting section or fluorescent X-ray detecting section; zero loss electron beam intensity and secondary electron intensity or Z contrast electron beam intensity or fluorescent X-ray intensity are measured at the same time by the electron spectrometer section and electron beam detecting section; the background and gain at the electron beam detecting section are corrected by the computation unit; and that the secondary electron intensity or Z contrast electron beam intensity or fluorescent X-ray intensity is divided by the zero loss electron beam intensity, it becomes possible to display a secondary electron image, Z contrast image or fluorescent X-ray image on an image display device in real time.

(Z Contrast Intensity)

Z contrast intensity is explained hereunder. When an electron beam accelerated to several hundred keV is converged to a thickness of an atom and irradiated into a specimen, the electron beam scatters in different direction with the atoms constituting the specimen. Because the angle and intensity are determined by the atomic scattering power in dependence upon the atomic number, if any foreign atom is contained in the atoms of the base material, the scatting intensity from the foreign atom differs from that from other atoms. For this reason, if the scattering electron beam intensity at each location is measured in synchronism with the electron beam scanning on the specimen, a two-dimensional image contrasted in dependence on the atomic species can be acquired. The contrast is proportional to the power of $2/3$ of the atomic number approximately. On an electron microscope, an image is acquired from the electron beam intensity that is scattered at a wider angle than 50 mrad. The intensity of this contrast is called Z contrast intensity. For more details, refer to a reference literature, for example, S. J. Pennycook and D. E. Jesson: Ultaramicroscopy 37 (1991) pp. 14-38.

Provided that the focus of the EELS spectrum is positioned between the electron spectrometer section and the electron beam detecting section and the beams are focused on the same position in both X direction and Y direction, a magnifying magnetic field lens is installed between the EELS spectrum and the detecting section, and that the EELS spectrum is magnified by the magnifying magnetic field lens to the same magnification in both X direction and Y direction and then projected onto the electron beam detecting section, it becomes possible to suppress the aberration strain of the magnified and projected EELS spectrum.

Since the magnifying magnetic field lens consists of a permanent magnetic lens for magnification and an electromagnetic lens for adjusting the focus onto a region the EELS spectrum image is formed, the magnification of the EELS spectrum is fixed.

In a prior art, an electro magnetic lens was employed from the necessity of varying the energy scattering (magnification). According to the present invention applied, because the energy scattering (magnification) can be fixed, a permanent magnetic lens offering high magnetic field stability can be employed. As compared to an apparatus using quadruple electromagnetic lenses, it is necessary for this apparatus to split an EELS spectrum of a wider range for measurement. Use of a permanent magnet, however, produces an effect that the optical system of the lens needs not be adjusted. In addition, because the drift of the EELS spectrum becomes smaller thanks to the magnetic field stability of the permanent magnet, automatic measurement and automatic computation of the EELS spectrum becomes feasible. Furthermore, since permanent magnetic lens is less expensive and lighter than an electromagnetic lens and requires no wiring, power source, nor cooling system, the apparatus can be of simpler construction, more compact, lighter, and less expensive.

Processing and functions of each section can be realized as hardware using a circuit device for each section, or as software using a computation circuit device such as microprocessor, personal computer or workstation.

BEST MODE FOR CARRYING OUT THE INVENTION

The First Embodiment

Figure 1:
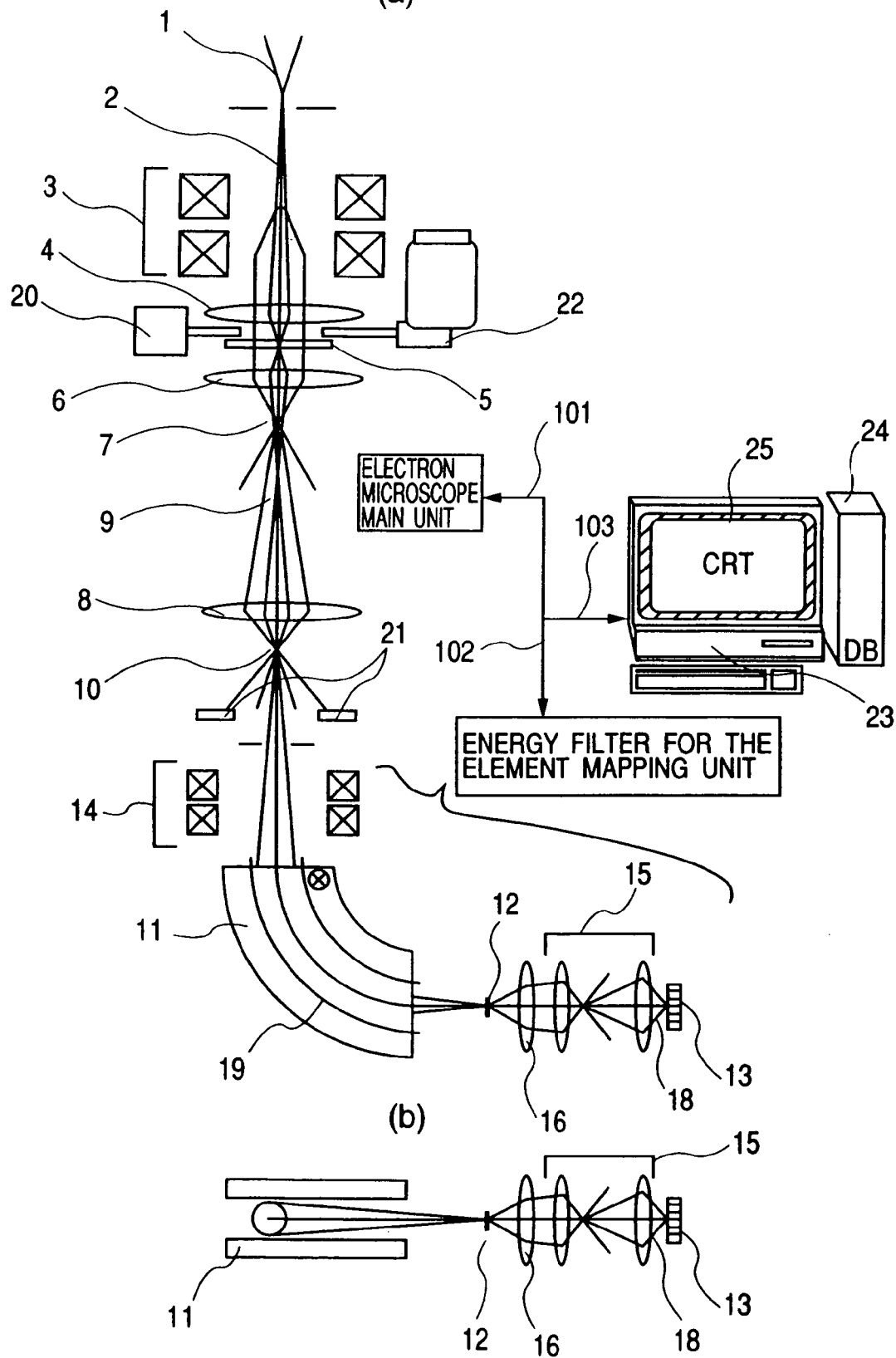
FIG. 1 is a schematic block diagram showing the main portion of the first embodiment of the present invention.

FIG. 1 is a schematic block diagram showing the main portion of a scanning transmission electron microscope (hereinafter, sometimes called the electron microscope) equipped with an energy filter for an element mapping unit according to an embodiment of the present invention. FIG. 1 (a) is a front view and FIG. 1 (b) is a view (plan view) of FIG. 1 (a) from an electron beam source 1. In this figure, the electron microscope body includes the components from an electron source 1 up to a Z contrast detector 21. The electron microscope contains structures, not shown, for controlling the electron beam scanning and others so as to function as an electron microscope. The portion from a sextuple electromagnetic lens 14 up to an electron beam detector 13 is shown as the energy filter for an element mapping unit. Signals to and from a computation unit 23 are transmitted via a signal line 103. Connected to the computation unit 23 are an input device such as keyboard, database 24, and image display device 25 as shown. The composition of an element mapping unit includes the computation unit 23, signal line 103, input device and database, and image display device 25, but sometimes the energy filter for the element mapping unit is also included.

The electron beam source 1 can be, for example, a cold cathode field emission type electron beam source. The electron beam 2 generated by the electron beam source 1 is deflected by an electron beam scanning coil 3. The deflected electron beam 2 is converged onto the surface of a specimen 5 by the magnetic field 4 above an objective lens, and then forms a scanning object point 7 just after the magnetic field 6 beneath the objective lens. The scanning object point 7 does not shift even when the electron beam 2 is scanned over the specimen by the electron beam scanning coil.

The electron beam diffracted on the specimen forms an image object point 9 before an image-forming lens 8. Although the image object point 9 shifts when the electron beam 2 is scanned, a transmission electron microscope (TEM) image formed at the image object point will not shift. In an ordinary EELS, the image object point 9 is formed at the object point 10 through the image-forming lens 8 and used as a virtual light source in measuring the EELS spectrum. In this embodiment, however, the scanning object point 7 is formed at the object point 10 through the image-forming lens 8 and used as a virtual light source. Since the aberration condition of an electron spectrometer 11 changes as the light source position shifts, the above ordinary method is not suitable for EELS measurement with high energy stability.

The electron beam using this object point 10 as a virtual light source enters the fan-shaped electron spectrometer 11. The magnetic field of the permanent magnet constituting the electron spectrometer 11 is generated as a magnetic field space perpendicular to the surface of FIG. 1. The electron beam entered into the electron spectrometer 11 is deflected by 90 degree and, at the same time, analyzed of its energy into spectrum, and then focused onto the energy scattering plane 12. In this embodiment, the energy scatting plane 12 is located between the electron spectrometer 11 and the electron beam detector 13, and yet the electron beam is focused at the same point in both energy scattering (X) direction and Y direction (double-focus). Further, a spectrum formed on the energy scattering plane 12 contains aberration peculiar to the electron spectrometer 11 (refer to FIG. 3).

Figure 3:
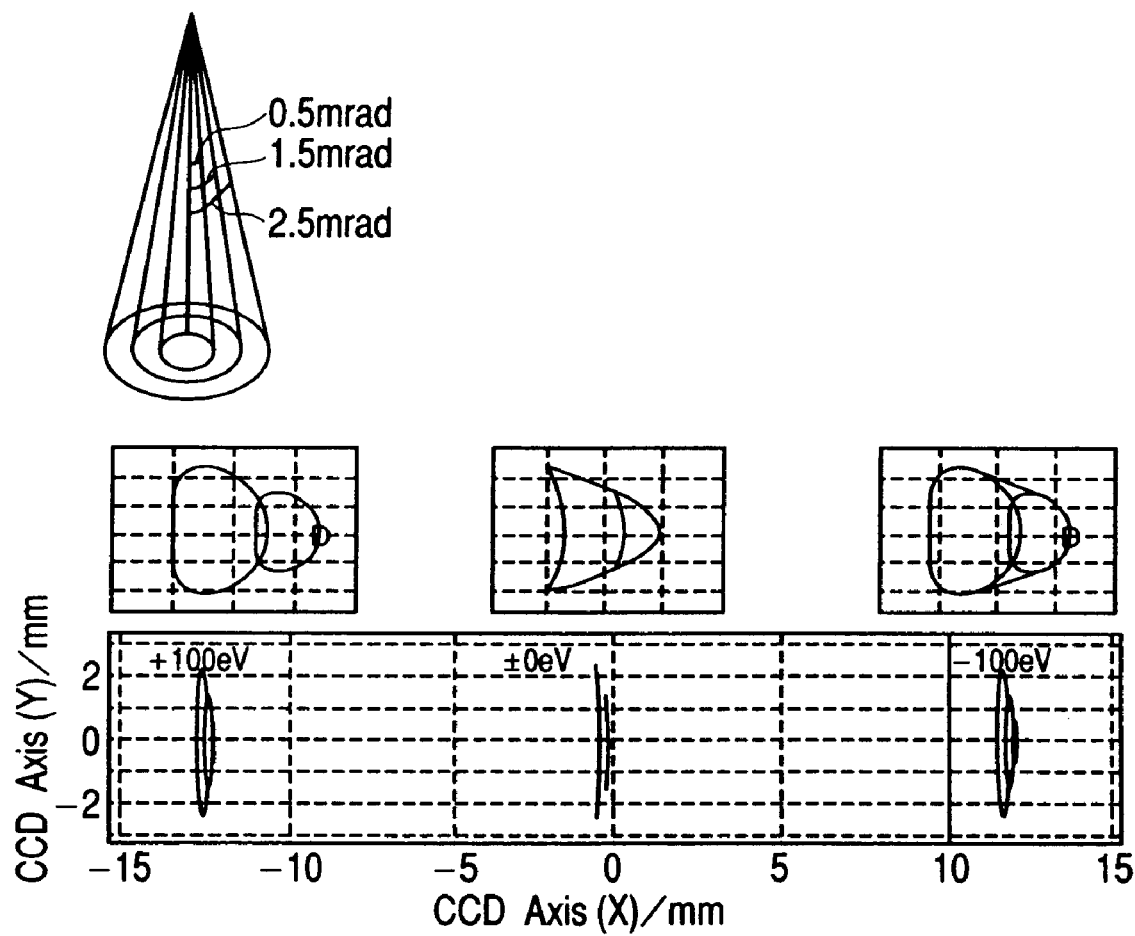
FIGS. 3 (a) and (b) are diagrams showing an example of secondary aberration of the EELS spectrum.
Figure 3:
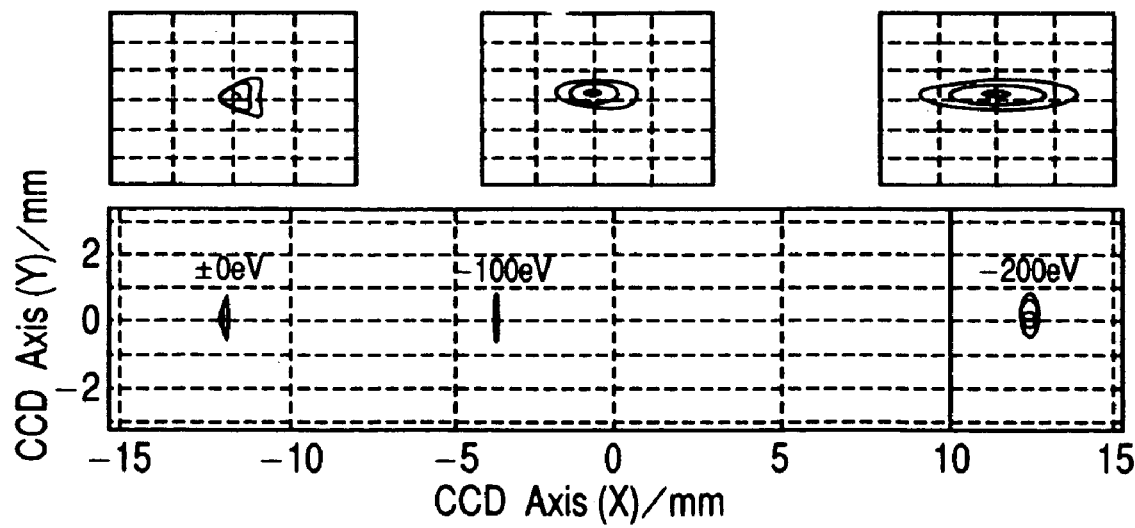

FIG. 3 shows two-dimensional images of the EELS spectrum 18 formed on the electron beam detector 13. FIG. 13 (a) shows in what shape the electron beam entered at the center and that with ±100 eV energy from the center are projected on the detector. FIG. 13 (b) shows how each electron beam with 0 eV, 100 eV and 200 eV loss energy is projected on the detector. Widening shown in FIG. 3 is a secondary aberration image 26 formed by the effect of the Y focus and secondary aberration of the apparatus. This aberration is corrected by the sextuple electromagnetic lens 14 installed upstream the electron spectrometer 11.

In this embodiment, a spectrum formed on the energy scatting plane 12 is about 1 eV/µm if the rotating radius of the electron beam of the electron spectrometer 11 is 100 mm. This is magnified to ×100 by a magnifying magnetic field lens 15. In doing this, the magnetic field of a focus-adjusting electromagnetic lens 16 is adjusted so as to match the focus position of the magnifying magnetic field lens 15 with the energy scattering plane 12. With the above, the EELS spectrum 18 projected on the electron beam detector 13 comes to 0.01 eV/µm. If a multi-channel plate array of 25 µm/channel is used as the electron beam detector 13, 0.25 eV/channel is available. Since the detector comprises of 1024 channels, approximately 250 eV becomes available in a full range.

A portion of this embodiment comprising of the sextuple electromagnetic lens 14, electron spectrometer 11, magnifying magnetic field lens 15, focus-adjusting electromagnetic lens 16, and electron beam detector 13 is called the energy filter for a element mapping unit. The energy filter for an element mapping unit is so installed that the zero loss electron beam is positioned at the center of the electron beam detector 13. The intensity of a core loss electron beam that has lost 250 eV or more is measured by accelerating the core loss electron beam in an accelerating tube 19 installed inside the electron spectrometer 11. To measure the intensity of a core loss electron beam that has lost 500 eV, 500 V is applied to the accelerating tube to accelerate the core loss electron beam. As a result of the above, the core loss electron beam that needs to be measured can be positioned at the center of the detector 13.

Since the afore-mentioned energy filter for an element mapping unit is structured using permanent magnets as the magnifying magnetic field lens 15, neither wiring for electromagnet nor cooling system for electromagnetic lens is needed, hence enabling to simplify the structure and lighten the weight of the apparatus. In addition, since electromagnets are used only in the sextuple electromagnetic lens 14 for removing secondary aberration and the electromagnetic lens 16 for adjusting the focus of the magnifying lens, less effect is caused in terms of power supply stability.

Achieving element mapping in real time requires that the energy loss peak can be recognized and that every electron beam that has lost the same energy during the measurement is focused on the same position of the electron beam detector. In this embodiment, any variation in the condition of the sextuple electromagnetic lens 14 gives little effect on the measurement. Even if the magnetic field of the electromagnetic lens 16 for adjusting the focus of the magnifying lens varies by about $\pm 5 \times 10^{-6}$ or so, the focus position shifts only by 1 μm or so and the magnification varies only by about $\pm 5 \times 10^{-4}$, giving no effect on the measurement.

The embodiment disclosed above has covered an example of scanning transmission electron microscope equipped with an energy filter for an element mapping unit that uses permanent magnets. Next, an embodiment of a real-time element mapping method according to the above embodiment is explained hereunder.

Figure 2:
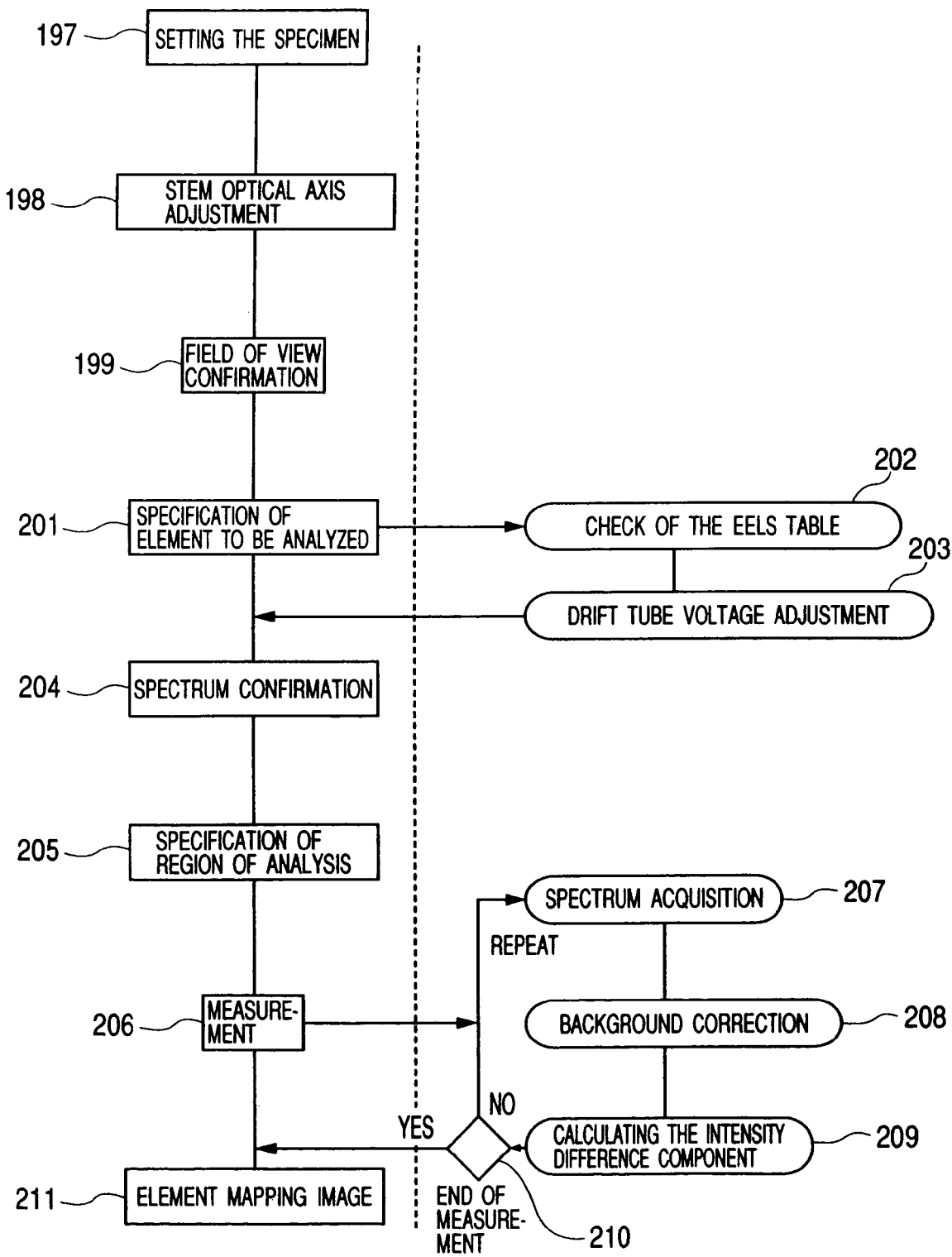
FIG. 2 is a diagram showing an example of processing for acquiring an element mapping image.

An example of processing for acquiring an element mapping image is explained hereunder, using FIG. 2.

With a combined analyzer of conventional EELS and STEM,

According to a prior art, a user must repeat a series of processes; (1) selecting an element to be analyzed→(2) checking the electron beam loss energy→(3) adjusting the drift tube voltage of a PEELS unit→(4) confirming the spectrum→(5) specifying a region of analysis→(6) measuring the electron beam loss energy intensity distribution→(7) correcting the background and gain of a measuring means→(8) specifying a background region→(9) specifying a background fitting function such as a power law model ($I=AE^{-r}$)→(10) specifying an integral region of the signal intensity→(11) displaying the signal intensity of the specified element at the measuring position on an image display device→(1), for every measuring position and every element to be analyzed so as to acquire an element distribution image.

According to the embodiment of the present invention, however, the operator is required to be involved only in (1) element specification process 201→(4) spectrum confirmation process 204→(5) analysis region specification process 205 for specifying a region of measurement; and other processes for the measurement including (2) checking the electron beam loss energy→(3) adjusting the drift tube voltage of an EELS unit→(6) measuring the electron beam loss energy intensity distribution→(7) correcting the background and gain of a measuring means→(8) specifying a background region→(9) specifying a background fitting function such as a power law model ($I=AE^{-r}$)→(10) specifying an integral region of the signal intensity→(11) displaying the signal intensity of the specified element at the measuring position on an image display device→(1) are repeatedly carried out, under the control of the computation unit 23, for every measuring point and/or every element to be analyzed by controlling the electron microscope itself and the energy filter for the element mapping unit, thereby enabling to acquire an element distribution image of a specified element in real time.

In other words, as an example shown in FIG. 2, a series of processes including (1) analysis element specification process 201 for selecting an element to be analyzed, (2) EELS table check process 202 for checking the electron beam loss energy, (3) drift tube voltage adjusting process 203 for adjusting the drift tube voltage, (4) spectrum confirmation process 204 for confirming the spectrum, and (5) analysis region specification process 205 for specifying a region of analysis are carried out.

Further, (6) measurement process 206 for measuring the electron beam loss energy intensity distribution is carried out by repeating the next processes 207 to 210. First, the spectrum acquisition process 207 for acquiring the spectrum is carried out, in which a process for correcting the background and gain of the electron beam detector 13 can be included. In (8) background correction process 208, the background region is specified and the background fitting function is specified.

In the strength difference calculation process 209, the integer region of the signal intensity is specified. Then, the measurement completion judgment process 210 for checking whether the measurement has completed at every measuring point and judging completion of the measurement. If not completed (in case of NO as shown), the processing returns to process 207. If completed (in case of YES as shown), (11) element mapping image display process 211 for displaying the signal intensity of a specified element at a specified measuring position on an image display device is carried out on the basis of the result from the measurement process 206.

Since the energy stability of an EELS spectrum of a conventional EELS is about $\pm 5 \times 10^{-6}$, the position of the energy loss peak drifts during the measurement by several channels on a multi-channel plate array of 25 μm/channel used as the electron beam detector 12. According to the afore-mentioned embodiment, however, since the energy stability of the EELS spectrum improves to about $\pm 1 \times 10^{-8}$, drift of the energy loss peak during the measurement can be controlled within one channel of the electron beam detector 13.

Figure 4:
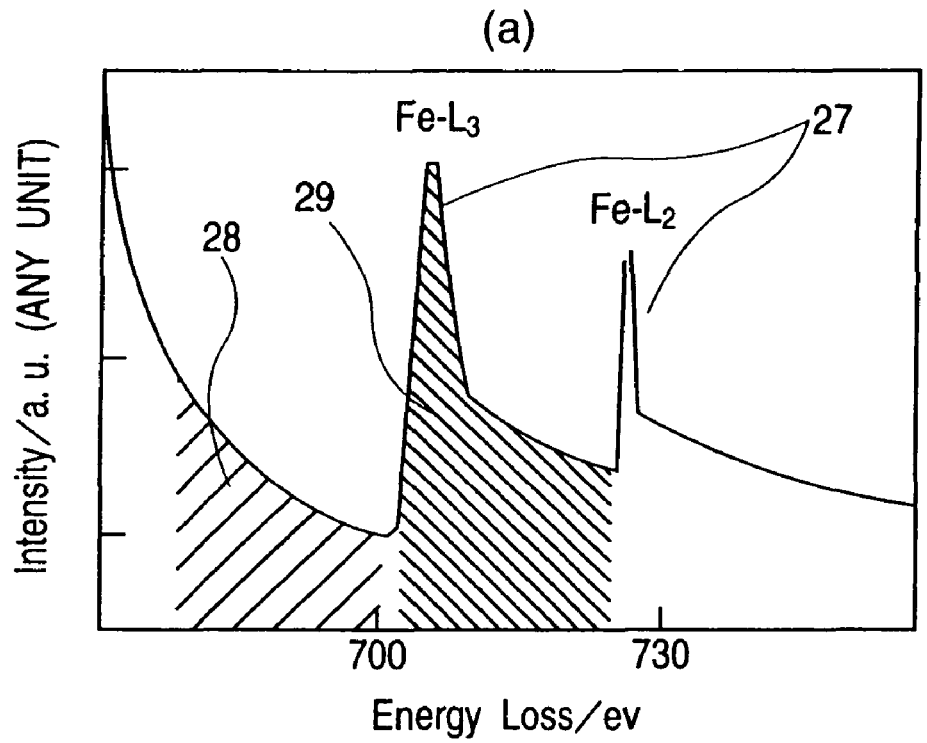
FIGS. 4 (a) and (b) are diagrams showing an example of the EELS spectrum of core loss electron.
Figure 4:
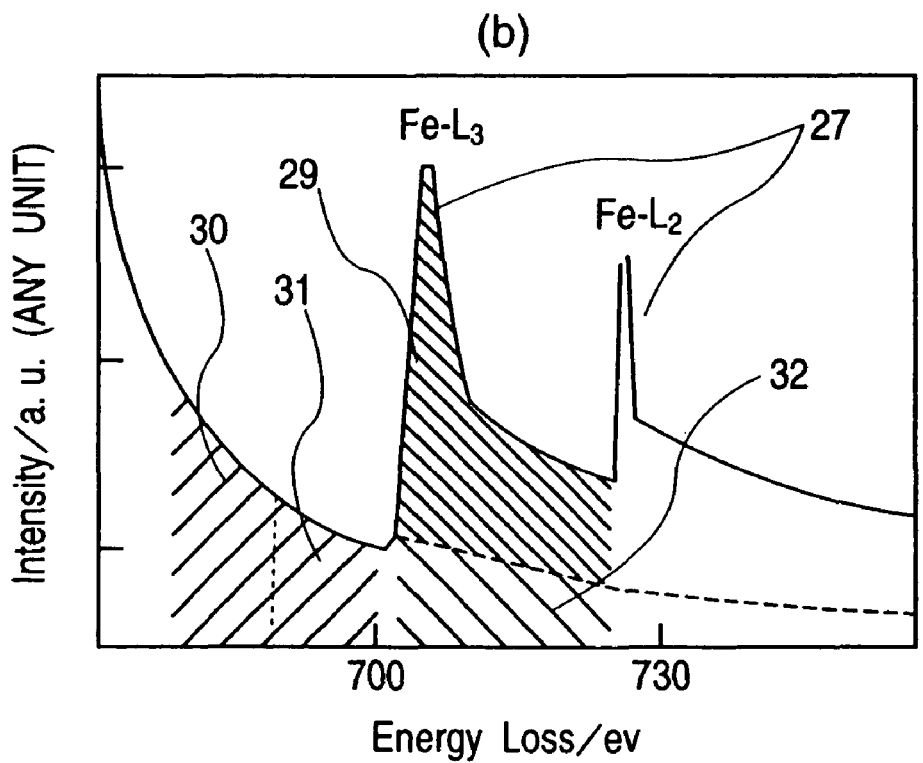

FIG. 4 shows shapes of the EELS spectrum of the core loss electron. Core loss electron is caused by excitation of an inner shell electron of an atom by electron beam, and it is an electron that has lost energy peculiar to the element.

(2-Window Method)

When a core loss spectrum is measured by a method where each region just before the core loss peak 27 (pre-window 28) and just after it (post-window 29) is regarded as a window (2-window method), it is necessary to determine the width of the window and the energy width between the windows. In this embodiment, this measuring operation is automated by maintaining these pieces of information on the database 24 in FIG. 1. With a conventional EELS, however, even if a similar database is provided, the user must determine the position and width of the windows judging from actual spectrum because of energy instability of the spectrum due to the shift of the electro-optical system. Thus, automated measurement is not feasible.

The database 24 stores condition data on the core loss energy (eV), window width (number of channels) and window interval (number of channels) corresponding to each element. When the user specifies an element to be measured, voltage equivalent to the core loss energy is applied to the accelerating tube 19 and the window width and interval given by the database 24 are applied to the electron beam detector 13. The electron beam intensity acquired from the two windows is corrected of the background and gain peculiar to the electron beam detector 13 by the computation unit 23, and then the intensity ratio of the two windows is calculated and the result is displayed on the image display device 25. On this occasion, a control signal 101 is outputted from the computation unit 23 to the electron microscope main unit via the signal line 103 and the above processing is interlocked with the electron beam scanning coil 3 so as to acquire an element distribution image in real time. This method enables to acquire an element distribution image with no effect of the background in short computation time.

(3-Window Method)

A 3-window method is explained hereunder, using FIG. 4 (b). Similarly as in the 2-window method explained in reference to FIG. 3, the database 24 stores condition data on the core loss energy (eV), window width (number of channels) and window interval (number of channels) and, when the user specifies an element to be measured, voltage equivalent to the core loss energy is applied to the accelerating tube 19. Then, the window width and interval given by the database 24 are applied to the electron beam detector 13 (See FIG. 4 (b), EELS spectrum is measured, and the result is corrected of the background and gain peculiar to the detector. The electron beam intensity of the two windows on the lower energy side of the core loss (pre-window-1 30 and pre-window-2 31) is calculated in accordance with the power law model ($I=AE^{-r}$) and the background 32 of the window on the higher energy side of the core loss is calculated. The calculated background 32 is then deducted from the electron beam intensity of the post-window 29 on the higher energy side of the core loss and the result is displayed on the image display device 25. As the control signal 101 is sent from the computation unit 23 to the electron microscope main unit via the signal line 103 to control the electron beam scanning coil 3 of the electron microscope, the above processing is interlocked with the scanning coil. Further, the control signal 102 is sent from the computation unit 23 to the energy filter for an element mapping unit via the signal line 103 to control the optical system and drift tube. Since intervention by operator can be minimized as a result of the above, it becomes possible to acquire an element distribution image in real time.

This method has an advantage that a quantitative element distribution image can be acquired. For quantification, the core loss intensity measured must be corrected by the zero loss intensity and film thickness of a specimen. Since the zero loss intensity and film thickness distribution image of a specimen can be measured together with the core loss intensity, a qualitative element distribution image can be acquired simply by doubling the time required for the measurement at each point so as to measure the zero loss intensity and film thickness distribution and correcting the result by the computation unit 23.

A typical data on the core loss peak 27 stored in the database 24 will be, in case of iron (Fe): EL2: 721 eV, EL3: 798 eV, 2-window method: W1: 50 channels, ΔW: 4 channels, W2: 50 channels, 3-window method: W1: 25 channels, ΔW12: 0 channel, W2: 25 channels, ΔW23: 2 channels, W3: 50 channels. The window width (W) and interval (ΔW) data may contain the energy width instead of the number of channels.

(Contrast Tuning)

Figure 5:
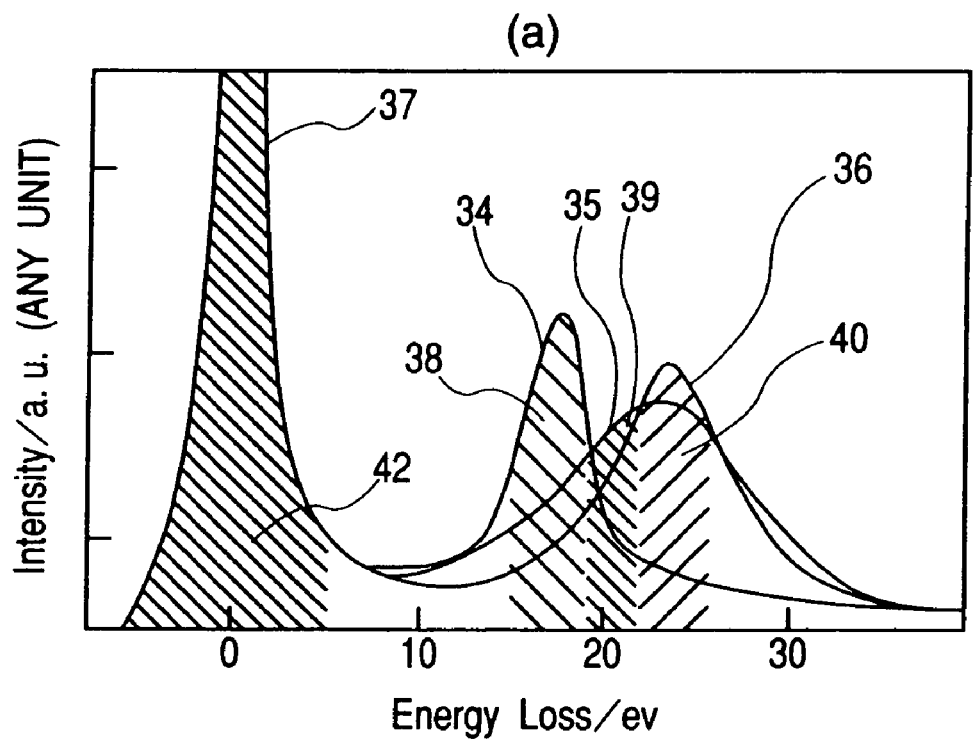
FIGS. 5 (a) and (b) are diagrams showing an example of the EELS spectrum of plasmon loss electron.
Figure 5:
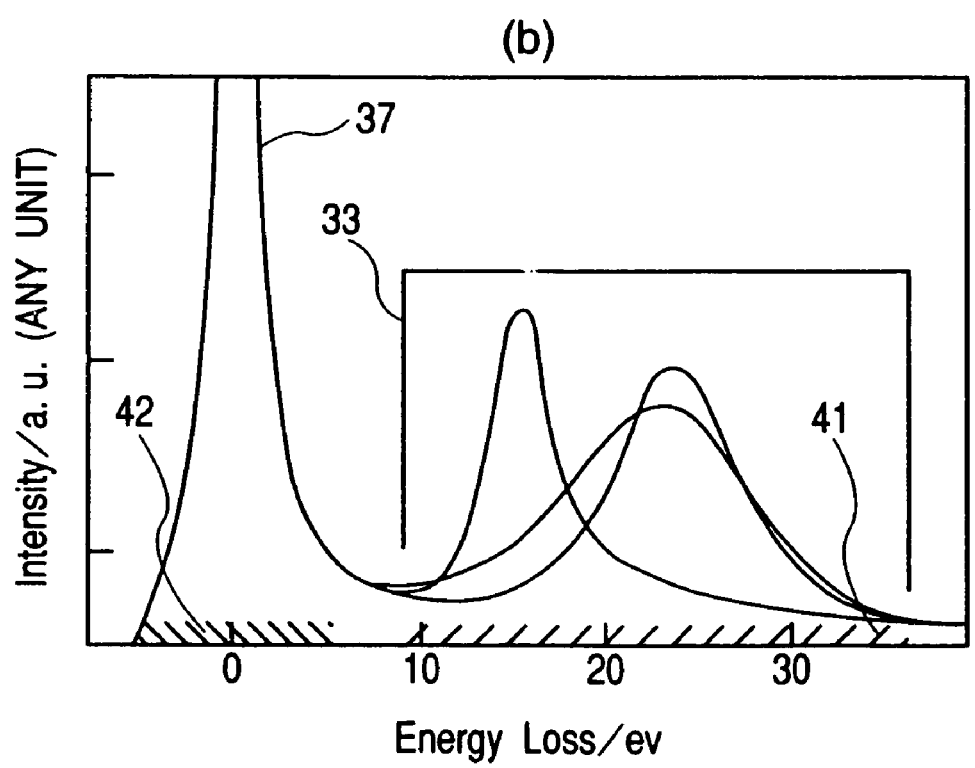

Next, how to acquire a contrast tuning image is explained hereunder, using FIG. 5. Different material may have different plasmon loss energy: for example, plasmon loss peak 34 of silicon, plasmon loss peak 35 of nitride silicone, and plasmon loss peak 36 of silicon oxide. Since the peak width of a plasmon loss is as small as 2 to 5 eV, 8 to 20 channels are necessary on the electron beam detector. Because an energy difference between the plasmon peak of each material is small, whether the material contained in the specimen has changed in quantity or the EELS spectrum has drifted cannot be distinguished with a conventional EELS. In this embodiment, however, because drift of the EELS spectrum is small enough, shift of the peak is caused only by a change in the quantity of the material in question. Thus, distinction of material by contract tuning becomes available.

The plasmon loss peak for each silicone, silicone nitride and silicone oxide is 17 eV, 19 eV and 23 eV, respectively. Data to be registered in the database will be: plasmon peak: $E_{si}$: 17 eV, W: 10 channels, $E_{siN}$: 19 eV, W; 10 channels, $E_{sio}$: 23 eV, W: 10 channels, respectively. The window width (W) data may contain the energy width instead of the number of channels.

In this embodiment, the contrast tuning method is first selected. Then, an element to be analyzed is specified. For example, silicone, silicone nitride and silicone oxide are selected. At the same time, display color is also specified (for example, intensity from silicone window 38 is in red, intensity from silicon nitride window is in blue, and intensity from silicone oxide window is in green). After retrieving the plasmon peak position data of silicone, silicon nitride and silicone oxide from the database, the voltage of the accelerating tube 22 of the electron spectrometer 11 is set to the center value of the element to be analyzed. Then, the window width of the plasmon peak measurement region is determined from the channel position of the detector corresponding to the peak position.

After correcting the background and gain peculiar to the electron beam detector 13, the electron beam intensity measured at each channel is accumulated within the range of the specified window. The acquired electron beam intensity is divided by the number of channels of each window to make an average electron beam intensity per channel. This electron beam intensity is displayed in different tints of a color specified previously on an image display device. When this processing is interlocked with the electron beam scanning coil 3 and carried out automatically, a contract tuning image can be acquired in real time.

If the zero loss intensity 37 is measured together in acquiring the contrast tuning image and the afore-mentioned average electron beam intensity is divided by this electron beam intensity, it is also possible to acquire a contrast tuning image that has been corrected of variation of incident electron seam intensity.

(Film Thickness Mapping)

In addition, if the whole plasmon loss peak 33 is set as a plasmon loss window 41 and a zero loss window 42 is set at the zero loss peak 37, a value relating to the film thickness of the specimen can be acquired by dividing the plasmon loss electron beam intensity by the zero loss intensity+plasmon intensity (total electron beam intensity measured). When this processing is interlocked with the electron beam scanning coil 3 and carried out automatically, a film thickness mapping image can be acquired in real time.

Film thickness mapping is important and essential information for the quantification of element distribution. According to this embodiment, since a core loss image and a film thickness mapping image can be acquired at the same time by varying the voltage of the accelerating tube 19, a quantitative element mapping image can be acquired very easily by calculation in the computation unit 23. In other words, the core loss intensity is a product of the film thickness of the specimen and the element quantity and electron beam scattering power in the measuring region. Because the electron beam scattering power is a constant peculiar to each element, the core loss intensity acquired must be divided by the film thickness to acquire the element quantity. When the core loss intensity and film thickness are measured at each measuring point and the core loss intensity is divided by the film thickness in the computation unit 23, a quantitative element distribution map can be acquired.

(Elimination of Chip Noise)

Lastly, elimination of chip noise is explained hereunder. Since a STEM acquires a two-dimensional image by scanning the electron beam with the help of the secondary electron detector 20, Z contrast detector 21 and fluorescent X-ray detector 22, various information can be acquired with high space resolution. The two-dimensional image, however, differs in measurement timing slightly from point to point. If a chip noise, which is a phenomenon where the incident intensity of the electron beam varies by time, occurs, the intensity of the measured data (secondary electron, transmitted electron, fluorescent X-ray, and EELS spectrum) also varies. As a result, there arises a problem that whether the acquired result is affected by a chip noise or true data from the specimen cannot be distinguished. Particularly on a STEM using a field emission type electron beam source, chip noise is apt to be caused.

Knowing that the EELS spectrum measurement can be operated together with the measurement of a secondary electron image, Z contrast image and fluorescent X-ray image using the secondary electron detector 20, Z contrast detector 21 and fluorescent X-ray detector 22, chip noise has been eliminated by utilizing the zero loss electron beam intensity as an intensity monitor for the incident electron beam.

When the zero loss intensity is measured (and corrected of the background and gain of the electron beam detector using the computation unit 23) according to this embodiment, the secondary electron intensity, Z contrast intensity and fluorescent X-ray intensity are measured at the same time or in parallel. By dividing the secondary electron intensity, Z contrast intensity and fluorescent X-ray intensity by the zero loss electron beam intensity using the computation unit 23, variation of the incident electron beam intensity can be eliminated. When this processing is interlocked with the electron beam scanning coil 3 and carried out automatically (that is, the apparatus is so controlled that the electron beam is moved onto a measuring point by operating the electron beam scanning coil 3 and measure and calculate there, and then the electron beam is moved onto another measuring point by operating the electron beam scanning coil 3 and measure and calculate there, and then another repeatedly), a secondary electron, Z contrast image and fluorescent X-ray image free from chip noise can be acquired.

Second Embodiment

The second embodiment of the present invention is explained hereunder. This embodiment covers an example of an element mapping unit wherein an element to be observed can be changed to another in the course of the observation so as to acquire a distribution image of multiple elements and observation position can be varied or observation magnification can be varied while observing an element distribution image.

Figure 6:
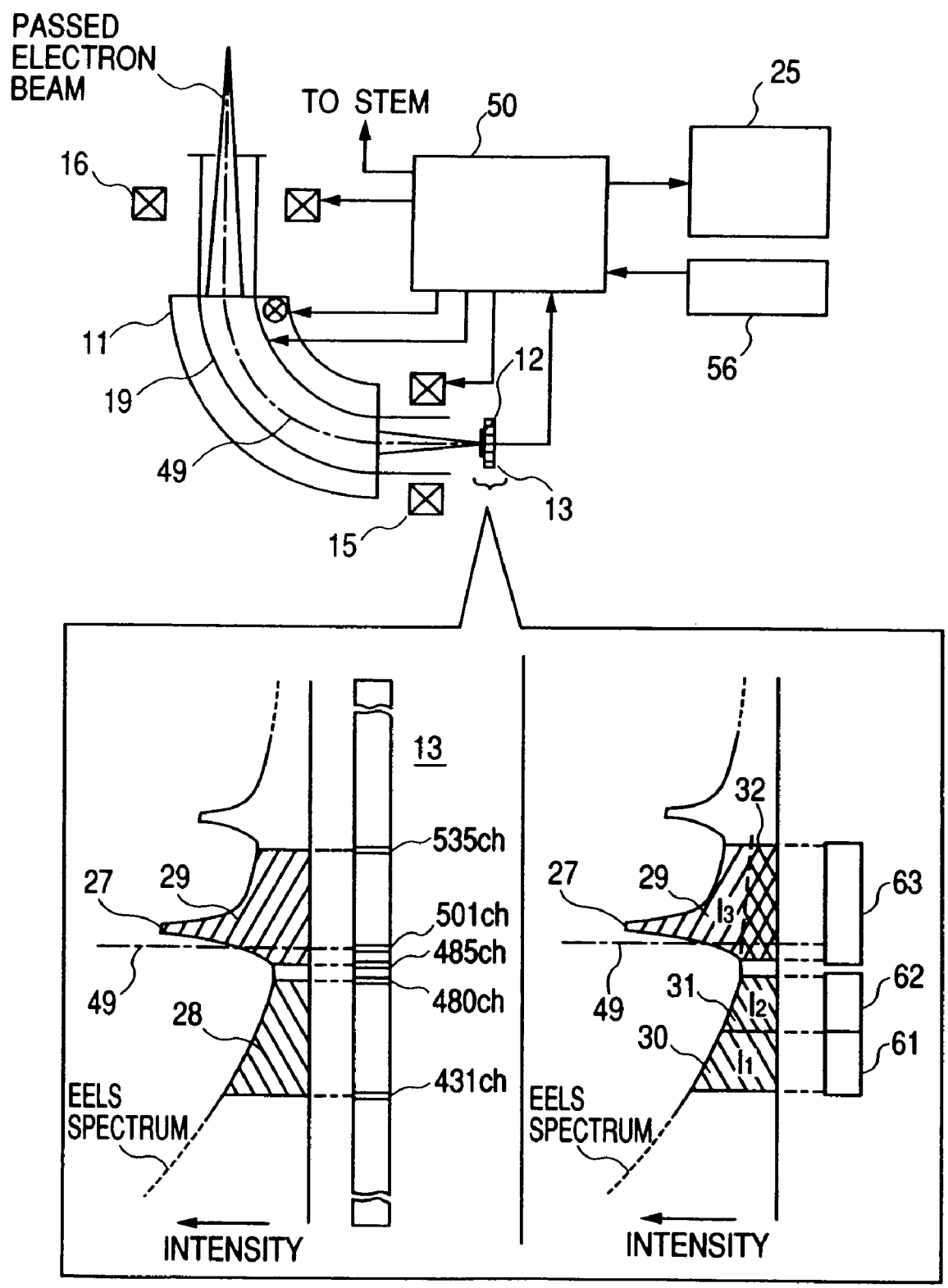
FIG. 6 is a diagram showing an element mapping unit according to the second embodiment of the present invention.

FIG. 6 shows an energy filter and control unit 50. For the energy filter in this embodiment, the electron beam detector 13 is installed at the position where the energy scattering plane 12 of the energy filter in the first embodiment is located, and the focus-adjusting electromagnetic lens 16 is provided upstream the electron spectrometer 11 and the magnifying lens 15 down stream the electron spectrometer 11.

In this embodiment, a scanning transmission electron microscope (STEM) explained in the first embodiment is employed (Refer to FIG. 1). A 1024-channel multi channel plate array is used for the electron beam detector 13. The electron spectrometer 11 is arranged so that the zero loss electron beam that has passed through the optical axis 49 of the electron spectrometer 11 enters the center channel (for example, 501st channel).

Figure 7:
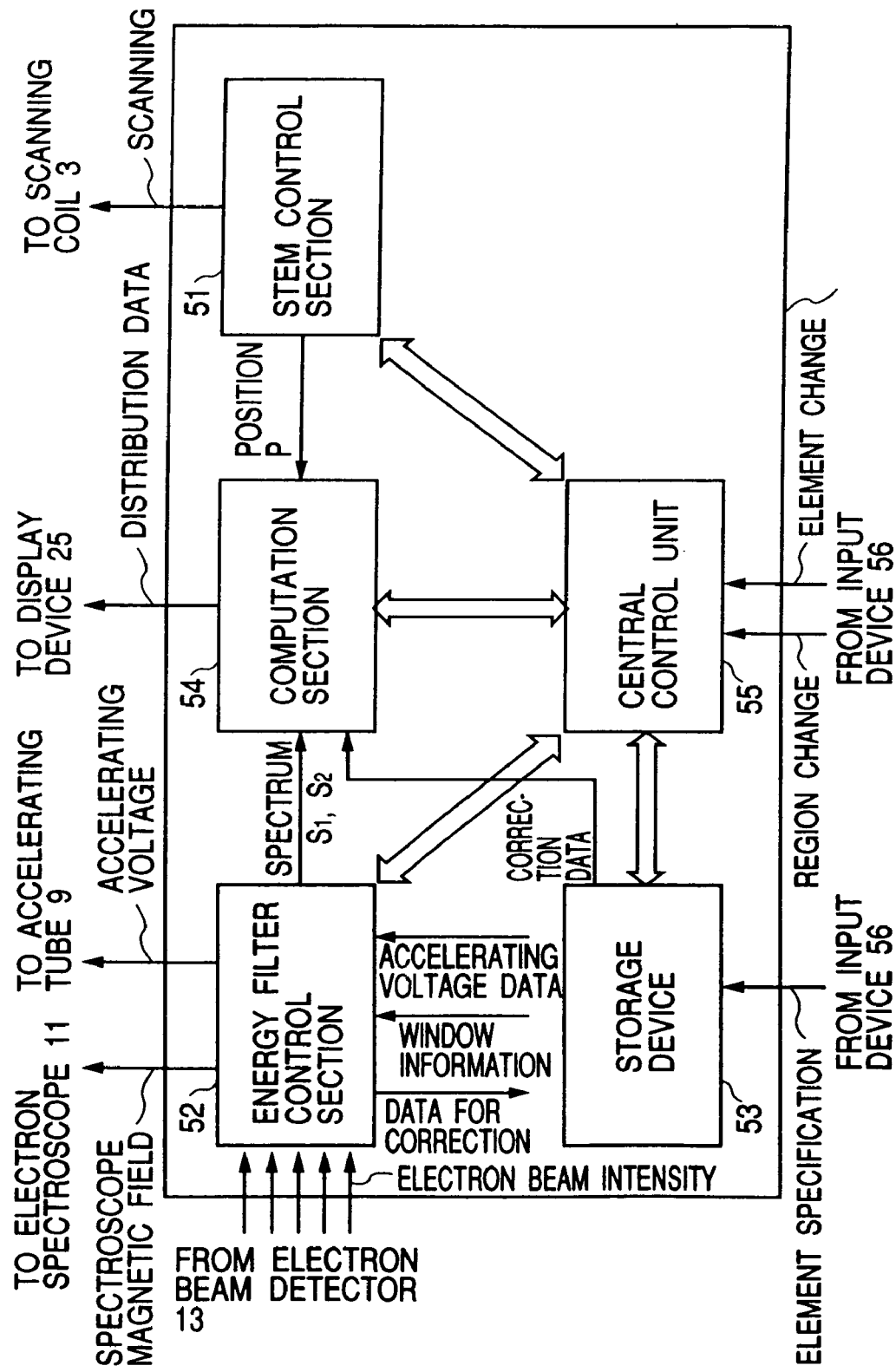
FIG. 7 is a diagram showing an example of a control unit.

FIG. 7 shows the control unit 50 of an element mapping unit according to this embodiment. The control unit 50 comprises of a STEM control section 51 that controls the STEM, energy filter control section 52 that controls the energy filter, storage device 53 that stores core loss energy (inner shell electron loss energy), electron beam intensity and correction data of each element, computation section 54 that carries out correction and electron beam ratio calculation, and central control unit 55 that control each section.

In the storage device 53, as in the first embodiment, acceleration voltage data corresponding to each element, position data W1 of the pre-window 28, position data W2 of the post-window 29, and interval ΔW between the pre-window 28 and post-window 29 have been stored. The position data W1 of the pre-window 28 is predetermined for each element by the position and width corresponding to the channel of the electron beam detector 13 so that the pre-window 28 covers a spectrum with a little less energy than the core loss peak 27, and so is the position data W2 of the post-window 29 so that the post-window 29 covers from a spectrum with a little energy than the core loss energy up to the core loss peak 27 and a spectrum a little greater than it. With the above data for each element stored in the storage device 53, the element mapping unit of this embodiment performs different control for each element automatically.

Figure 8:
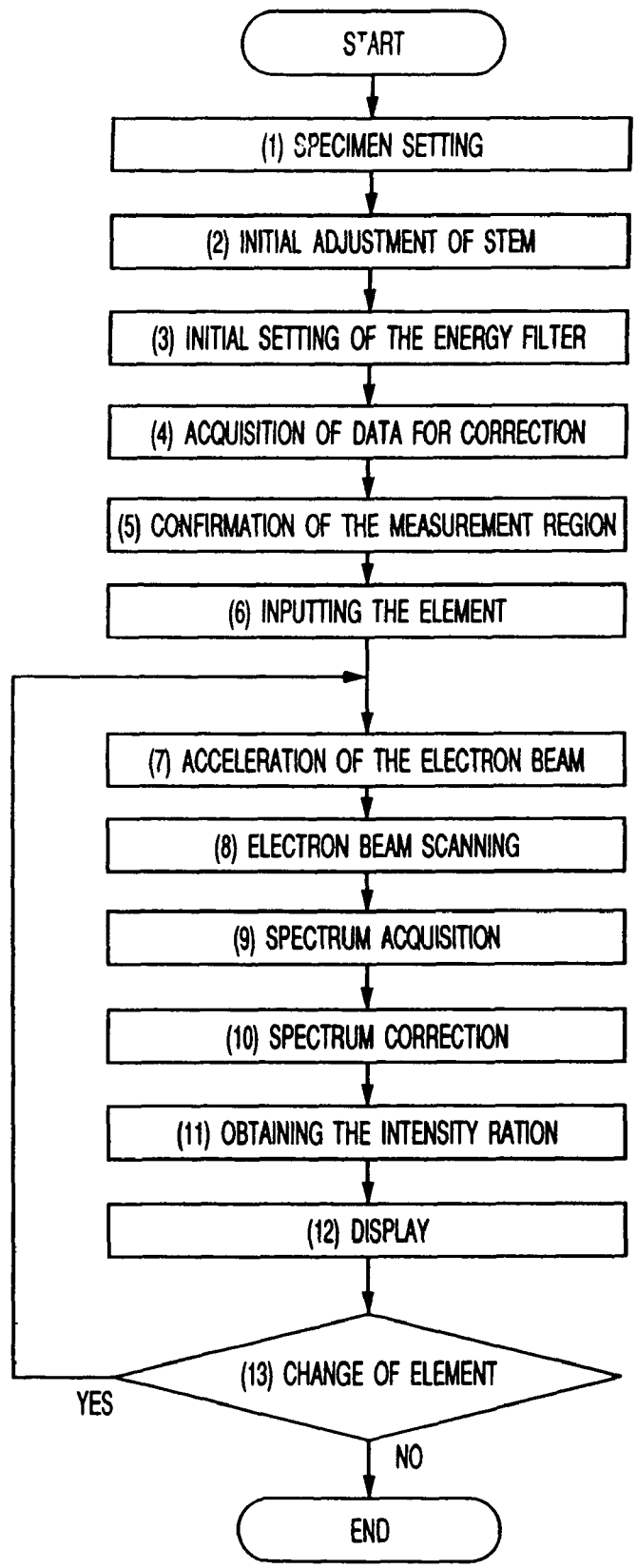
FIG. 8 is a diagram showing an example of processing for acquiring an element mapping image.

How to acquire multiple element mapping images using the element mapping unit of the embodiment is explained hereunder. FIG. 8 shows a processing flow.

The operator (1) sets a specimen on a STEM, (2) carries out initial adjustment of the STEM, including adjustment of the optical axis of the STEM, and (3) carries out initial adjustment of the energy filter. The initial adjustment of the energy filter includes adjusting the magnetic field of the electron spectrometer 11 so that the zero loss electron beam passes through the optical axis 49 of the electron spectrometer 11, adjusting the magnetic field of the focus-adjusting electromagnetic lens 16 so that the electron beam analyzed into spectrum focuses onto the energy scattering plane 12, and adjusting the magnetic field of the magnifying lens 15 so that the spectrum spreads over a specified region of the energy scattering plane.

Next, the central control unit 50, controlling the STEM control section 51 and energy filter control section 52, (4) acquires data for background correction and gain correction and stores the date in the data storage device 53. (5) The operator confirms the region on the specimen that needs to be analyzed for element distribution, and (6) inputs the element that needs to be first analyzed for distribution from an input device 56. In this embodiment, Fe is inputted.

Then, measurement of the electron beam intensity starts. (7) The central control unit 55 sends the acceleration voltage data for Fe, 708 V from the storage device 53 to the energy filter control section 52. The energy filter control section 52 applies the acceleration voltage 708 V, corresponding to the core loss energy, to the accelerating tube 19. (8) The central control unit 55 controls the STEM control section 51 and moves the electron beam onto the measuring point P1 on the region to be measured for element distribution.

The electron beams transmitted through the specimen are analyzed into spectrum by the electron spectrometer 11. Of the electron beams analyzed into spectrum, the core loss electron beam corresponding to the core loss energy 708 V for Fe passes along the optical axis 49 of the electron spectrometer 11 and enters into the 501st channel of the electron beam detector 13.

On this occasion, the electron bean intensity entered into each channel of the electron beam detector 13 is inputted into the STEM control section 51. (9) The STEM control section 51 outputs the spectrum S1 covered by the pre-window 28 and the spectrum S2 covered by the post-window 29 in accordance with the window data acquired from the storage unit, that is, W1 (in case of Fe, data on 50 channels corresponding to the 431st to 480th channels of the electron beam detector 13), W2 (in the same case, data on 50 channels corresponding to the 485th to 534th channels of the electron beam detector 13), and ΔW (in the same case, data on 4 channels of the electron beam detector 13). The spectrum S1 represents the electron beam intensity entered into the 431st to 480th channels, that is, a spectrum in a range of 704.5 to 707 eV, and the spectrum S2 represents the electron beam intensity entered into the 485th to 534th channels, that is, a spectrum in a range of 704 to 714.5 eV including the core loss peak 207. The storage device 53 stores these spectrum S1 and spectrum S2 along with the electron beam position P1 on the specimen.

Next, (10) the computation section 54 carries out the background and gain correction of the spectrum S1 and spectrum S2, using the data for correction stored in the storage device 53 in step (4) above. (11) The computation section 54 divides the corrected spectrum S1 by the corrected spectrum S2 so as to acquire the electron beam intensity. Then, superimposes the measurement region on the intensity ratio at position P and displays the result on the display device 25 in different contrast proportional to the intensity ratio and in different color for each element.

Until a different element is specified, the central control unit 55 controls the STEM control section 51, moves the electron beam to the next measurement point P2, and repeat steps (7) to (12). (13) When the operator changes the element to Cu, the acceleration voltage corresponding to Cu is applied to the accelerating tube 19 in step (7), a spectrum is acquired using the window data corresponding to Cu in step (9), and steps (7) to (12) are repeated in the same manner as for Fe. Even when another element is specified, a two-dimensional element distribution image can be acquired by repeating steps (7) to (12) in accordance with the applicable data stored previously.

According to the mapping unit of the embodiment, since the acceleration voltage data and window data on each element have already been prepared in the storage device 53 and the control unit 50 performs measurement for the changed element immediately, the operator is allowed to change the element to observed in the course of the observation and confirm a two-dimensional element distribution image on the display device 24 immediately. Beside, since every electron beam entered into the energy filter passes through the object point 10, aberration strain on the electron spectrometer 11 can be minimized and high energy stability is achieved. As a result, drift of the electron energy loss spectrum acquired by analyzing the electron beam into spectrum can be minimized and element distribution with higher accuracy can be acquired.

Figure 9:
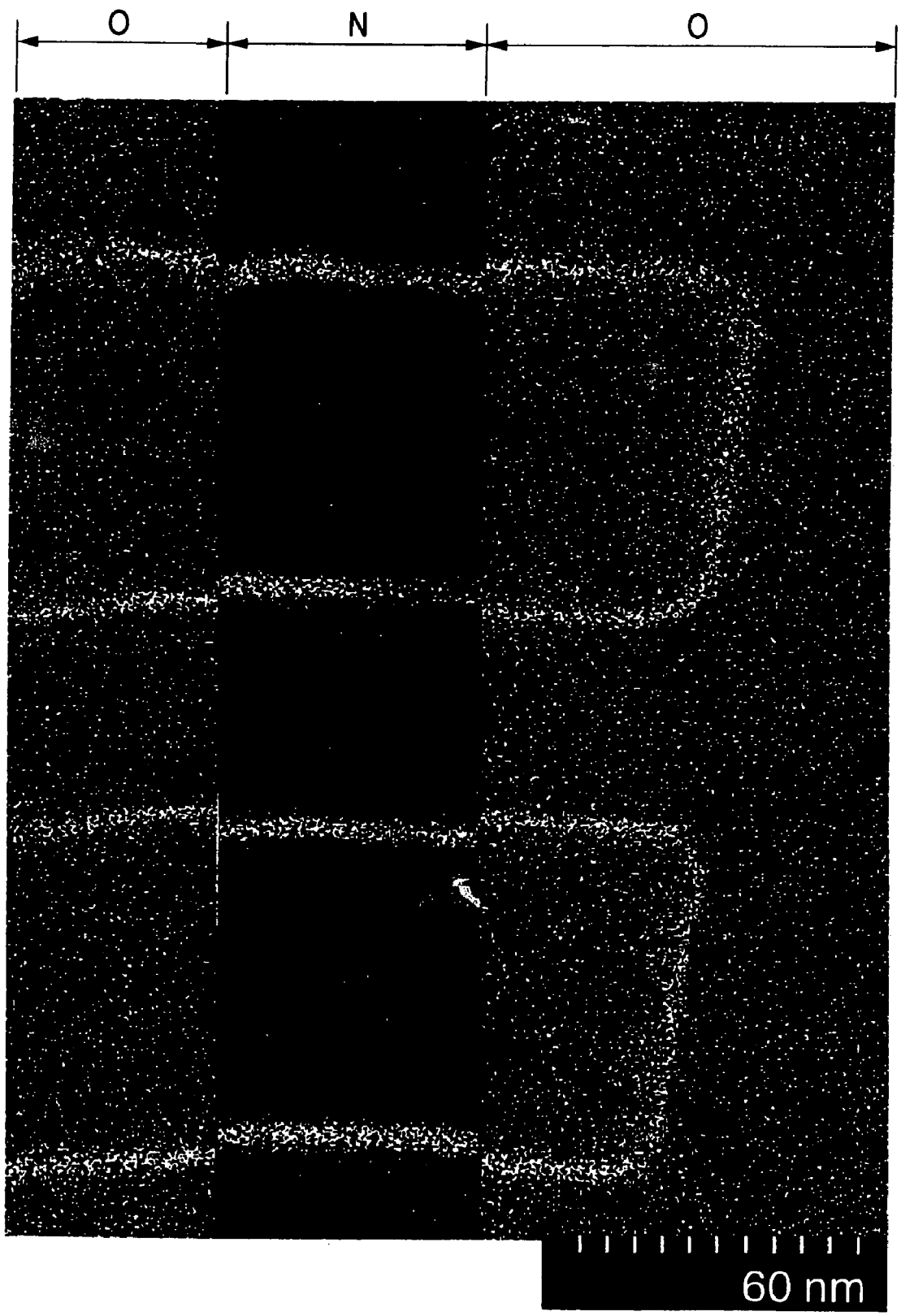
FIG. 9 is a diagram showing an example of a two-dimensional element distribution map of a semiconductor element.

An example of measurement on a semiconductor element using the mapping unit of the embodiment is explained hereunder. FIG. 9 is a two-dimensional element distribution image acquired by measurement where the element to be analyzed is switched oxygen O→nitrogen N→oxygen O. The specimen is a capacitor portion of 64 Mega DRAM (dynamic random access memory), and silicon oxide film and silicon nitride film are used as the insulation film. It was possible even with a prior art to acquire a two-dimensional distribution image of oxygen and nitrogen separately, but impossible to know the positional relationship between the silicon oxide film and silicon nitride film from these two-dimensional images. With this embodiment, however, two different distribution images of oxygen and nitrogen can be acquired in the same measurement region, and accordingly the positional relationship between the silicone oxide film and silicon nitride film can be defined at high resolution in nanometers or less.

Although the element to be observed is changed in the course of the observation in this embodiment, it is also possible to change the measurement region of the element or change the magnification of the observation while observing the element distribution image. As a result, a rough region where the element in question exists can be found out and accordingly the filed of view can be confirmed more quickly.

It is advisable that a means for specifying an element and a means for specifying a measurement region be provided on the input device 56 for smooth change of the element and/or measurement region to be analyzed for distribution. For example, it is advisable that selection buttons for various elements and available measurement regions on the specimen are displayed along with the two-dimensional element distribution map of the region measured already. The operator specifies a button for the element to be analyzed in case of changing the element and specifies a region to be measured in case of changing the measurement region.

It is also possible in obtaining the element distribution that the position P of the electron beam is not moved but fixed and spectra of multiple elements are measured. Although the time required for the measurement increases by the number of sorts of elements in this case, two-dimensional element distribution of multiple elements can be acquired simply by single scanning over the measurement region of the specimen.

Besides, although the window data stored in the storage device is utilized in step (9) in this embodiment, it is also allowable that the operator observes the electron energy loss spectrum on the display device 25 and determines the pre-window 28 and post-window 29 so as to use them as the window data.

Besides, although the accelerating tube 19 is employed to accelerate the core loss electron beam in this embodiment, it is also allowable to provide other accelerating means between the specimen 5 and the focus-adjusting lens 16.

Although a multi-channel plate array is employed as the electron beam detector 13 in this embodiment, it is also allowable to employ scintillation detectors 61 to 63 corresponding to each window width (See FIG. 6). With these, a two-dimensional element distribution image is generated by the 3-window method. That is, the scintillation detector 61 corresponds to the pre-window-1 30, scintillation detector 62 to the pre-window-2 31, and scintillation detector 63 to post-window 29. The scintillation detectors 61 to 63 convert the intensity of the entered electron beam into electrical signals and input into the STEM control section 51.

Provided that, the STEM control section 51 outputs the intensity I1, I2, and I3 of the entered electron beam to each detector in step (9) and, after these electron beam intensities are corrected by the computation section 54 in step (10), the background electron beam intensity 32 is acquired by applying I1 and I2 to the power law model ($I = A \times e^{-r}$) in step (11), and that the difference from the electron beam intensity I3 is calculated, quantitative element distribution can also be acquired.

Besides, scintillation detectors with fixed width (for example, 1 mm/channel) can be employed instead of the scintillation detectors corresponding to each window width.

Further, in the contrast tuning method, it is also allowable to change the element in the course of the observation and measure the plasmon peak as in this embodiment.

INDUSTRIAL APPLICABILITY

According to the present invention, a combined analyzer of EELS and STEM can provide an apparatus and method that enable to acquire an element distribution image in real time.

What is claimed is:

1. A scanning transmission electron microscope comprising:
   an electron beam source to generate electron beams;
   a scanning section to scan the electron beam;
   objective lens to converge the electron beam onto a specimen;
   an electron spectrometer that analyzes into spectrum the energy of the electron beam transmitted through the specimen, the electron spectrometer having an accelerating tube to accelerate the electron beam;
   a plurality of electron beam detectors that are capable of a simultaneous measuring of at least two energy ranges of spectra for the electron beam that lost specific energy;
   a storage device which stores acceleration voltage data and window information for different elements to be analyzed;
   an input device to select a measurement region and an element to be analyzed; and
   a control unit that controls the accelerating tube so that the electron beam, which has lost specific energy corresponding to a selected element to be analyzed, enters into a fixed position in the electron beam detectors, based on the data stored in the storage device; and detects the selected element to be analyzed on the basis of the intensity of the electron beam within a predetermined energy range out of those electron beam intensities detected above; distribution images of different elements being obtained by switching objective elements at a same measurement region during observation of one specimen.

2. A scanning transmission electron microscope according to claim 1, wherein
   the control unit contains a storage section that stores in memory the acceleration voltage for accelerating the electron beam that has lost specific energy and the energy range of the electron beam to be used for detecting the element to be analyzed; and
   a computation section that detects the element to be analyzed using the electron beam intensity within the aforementioned energy range stored previously.

3. A scanning transmission electron microscope according to claim 2, wherein
   the storage section stores correction data for eliminating the effect peculiar to the electron beam detectors from the detected electron beam; and
   the computation section corrects the detected electron beam in accordance with the correction data.

4. A scanning transmission electron microscope according to claim 2, wherein
   the electron beam detectors contain multiple electron beam detecting sections corresponding to the electron beam energy;
   the storage section stores the $1^{st}$ energy range, which is a range including the core loss peak, and the $2^{nd}$ energy range, which is a range lower than the core loss peak, out of an inner shell electron energy loss spectrum of the element to be analyzed;
   the control unit detects the $1^{st}$ electron beam intensity detected by the electron beam detecting section corresponding to the $1^{st}$ energy range and the $2^{nd}$ electron beam intensity detected by the electron beam detecting section corresponding to the $2^{nd}$ energy range on the basis of the stored $1^{st}$ energy range and $2^{nd}$ energy range;
   the computation section divides the $1^{st}$ electron beam intensity by the $2^{nd}$ electron beam intensity so as to detect the element to be analyzed.

5. A scanning transmission electron microscope according to claim 2, wherein
   the electron beam detectors contain multiple electron beam detecting sections corresponding to the electron beam energy;
   the storage section stores the $1^{st}$ energy range, which is a range including the core loss peak, and the $2^{nd}$ and $3^{rd}$ energy ranges, which are two ranges each lower than the core loss peak, out of an inner shell electron energy loss spectrum of the element to be analyzed;
   the control unit detects the $1^{st}$ electron beam intensity detected by the electron beam detecting section corresponding to the first energy range, $2^{nd}$ electron beam intensity detected by the electron beam detecting section corresponding to the $2^{nd}$ energy range, and $3^{rd}$ electron beam intensity detected by the electron beam detecting section corresponding to the $3^{rd}$ energy range on the basis of the stored $1^{st}$ energy range, $2^{nd}$ energy range, and $3^{rd}$ energy range;
   the computation section acquires the background intensity of the $1^{st}$ energy range in accordance with the $2^{nd}$ electron beam intensity and $3^{rd}$ electron beam intensity, and calculates the difference between the $1^{st}$ energy range and the acquired background intensity so as to detect the element to be analyzed.

6. A scanning transmission electron microscope according to claim 2, wherein
   the electron beam detectors contain multiple electron beam detecting sections corresponding to the electron beam energy;
   the storage section stores the plasmon energy range including the plasmon peak out of the inner shell electron energy loss spectrum of the element to be analyzed;
   the control unit detects the plasmon loss intensity of the electron beam detected by the electron beam detectors corresponding to the plasmon energy range on the basis of the stored plasmon loss energy range; and
   the computation section detects the element to be analyzed on the basis of the detected plasmon loss intensity.

7. A scanning transmission electron microscope according to claim 1, wherein
   the control unit controls the accelerating tube so that the $1^{st}$ electron beam, which has lost specific energy corresponding to the $1^{st}$ element to be analyzed, enters into a fixed position in the electron beam detectors;
   detects the $1^{st}$ element on the basis of the $1^{st}$ electron beam intensity in a predetermined energy range out of the detected $1^{st}$ electron beam intensities;
   when the second element to be analyzed is inputted from the outside,
   controls the accelerating tube so that the $2^{nd}$ electron beam, which has lost specific energy corresponding to the $2^{nd}$ element to be analyzed, enters into a fixed position in the electron beam detectors, and detects the $2^{nd}$ element on the basis of the $2^{nd}$ electron beam intensity in a predetermined energy range out of the detected $2^{nd}$ electron beam intensities.

8. An element mapping method that generates a distribution image of an element contained in an object to be analyzed on the basis of the energy spectrum of an electron beam transmitted through the object to be analyzed and the irradiation position of the electron beam on the object to be analyzed; including scanning irradiated electron beams onto the object to be analyzed;

accelerating the electron beam transmitted through the object to be analyzed;

analyzing into spectrum the energy of the electron beam transmitted through the object to be analyzed;

detecting the intensity of the electron beam by a plurality of electron beam detectors, the detectors are capable of a simultaneous measuring of at least two energy ranges of spectra for the electron beam that lost specific energy;

retrieving from a storage device acceleration voltage data and window information for an element to be analyzed;

detecting the element to be analyzed on the basis of the electron beam intensity;

moving the position of the electron beams to be irradiated onto the object to be analyzed; wherein the acceleration includes accelerating the electron beam so that the electron beam, which has lost specific energy corresponding to the element to be analyzed, enters into a fixed position in the electron beam detectors, based on the data retrieved from the storage device; and the detecting the element includes detecting the element to be analyzed on the basis of the intensity of the electron beam within a predetermined energy range out of those electron beam intensities detected above;

accepting an input to select another element to be analyzed for a same measurement region; and switching to the other element to be analyzed to obtain distribution images for the element and the other element at the same measurement region.

9. An element mapping method according to claim 8, wherein switching the element to be analyzed to the other element includes:

accelerating the electron beam so that the electron beam, which has lost specific energy corresponding to the other element, enters into a fixed position in the electron beam detectors; and detecting the other element to be analyzed on the basis of the intensity of the electron beam within a predetermined energy range corresponding to the other element out of those electron beam intensities that are detected when the electron beam, which has lost specific energy corresponding to the other element, enter into the electron beam detectors.

* * * * *